(12) United States Patent
Oh et al.

(10) Patent No.: US 10,833,000 B2
(45) Date of Patent: Nov. 10, 2020

(54) DISPLAY DEVICE

(71) Applicant: Samsung Display Co., Ltd., Yongin-si (KR)

(72) Inventors: Myong-soo Oh, Asan-si (KR); Hyunchul Jin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 16/237,550

(22) Filed: Dec. 31, 2018

(65) Prior Publication Data

US 2019/0206784 A1 Jul. 4, 2019

(30) Foreign Application Priority Data

Jan. 2, 2018 (KR) ........................ 10-2018-0000383

(51) Int. Cl.
   *G09G 1/00*    (2006.01)
   *H01L 23/498*  (2006.01)
   *H01L 27/32*   (2006.01)
   *G02F 1/1362*  (2006.01)
   *H01L 27/12*   (2006.01)
   *G02F 1/1345*  (2006.01)
   *H01L 23/00*   (2006.01)

(52) U.S. Cl.
   CPC .... *H01L 23/49838* (2013.01); *G02F 1/13452* (2013.01); *G02F 1/13458* (2013.01); *G02F 1/136286* (2013.01); *H01L 23/4985* (2013.01); *H01L 24/50* (2013.01); *H01L 27/124* (2013.01); *H01L 27/3276* (2013.01); *G09G 2310/0281* (2013.01); *H01L 27/3223* (2013.01)

(58) Field of Classification Search
   CPC ....... H01L 23/498; H01L 27/32; H01L 27/12; H01L 23/00
   See application file for complete search history.

(56) References Cited

U.S. PATENT DOCUMENTS

2016/0079153 A1* 3/2016 Seo .................... H01L 23/49838
                                                                257/668
2018/0188572 A1* 7/2018 Lin ......................... H01L 24/13

FOREIGN PATENT DOCUMENTS

KR      10-1422746       7/2014
KR      10-2014-0136233  11/2014
(Continued)

*Primary Examiner* — Michael A Faragalla
(74) *Attorney, Agent, or Firm* — H.C. Park & Associates, PLC

(57) ABSTRACT

A display device includes a display panel comprising a first substrate, a second substrate provided on the first substrate, and side electrodes provided on a side surface of the first substrate and a side surface of the second substrate aligned to the side surface of the first substrate; a driver unit comprising a circuit board, driving electrodes provided on the circuit board to face the side electrodes, and driving signal lines provided on the circuit board, the driving signal lines are connected to the driving electrodes, respectively; and an adhesive member provided between the side electrodes and the circuit board, the adhesive member comprising: a first adhesive portion configured to adhere and electrically connect a first driving electrode of the driving electrodes to a first side electrode of the side electrodes; and a second adhesive portion configured to adhere the circuit board to the first side electrode.

20 Claims, 11 Drawing Sheets

(56) References Cited

FOREIGN PATENT DOCUMENTS

| KR | 10-2015-0011731 | 2/2015 |
| KR | 10-2015-0047711 | 5/2015 |

\* cited by examiner

DISPLAY DEVICE

CROSS REFERENCE TO RELATED APPLICATIONS

This application claims priority from and the benefit of Korean Patent Application No. 10-2018-0000383, filed on Jan. 2, 2018, which is hereby incorporated by reference for all purposes as if fully set forth herein.

BACKGROUND

Field

Exemplary embodiments/implementations of the invention relate generally to a display device and, more specifically, to a display device, in which a driver unit is provided on a side surface of a display panel.

Discussion of the Background

A module assembling system, which is one of the back-end systems for a process of fabricating a display panel, is used to electrically connect the display panel and a driver chip. In such a connection process, a method of mounting the driver chip is classified into a chip-on-glass (COG) mounting method and a tape-automated-bonding (TAB) mounting method.

In the COG mounting method, a driver chip is directly mounted on gate and data regions of a display panel and is used to transmit electrical signals to the display panel. In general, an anisotropic conductive film (ACF) is used to bond the driver chip to the display panel.

In the TAB mounting method, a tape carrier package mounted with a driver chip is bonded to a display panel. In this method, an anisotropic conductive film is also used to bond the display panel to an end region of a tape carrier package and to bond a printed circuit board to another end region of the tape carrier package.

Recently, a structure, in which a tape carrier package is disposed on a side surface of a display panel, is being studied to increase an area of an image display region of a display device.

The above information disclosed in this Background section is only for understanding of the background of the inventive concepts, and, therefore, it may contain information that does not constitute prior art.

SUMMARY

Devices constructed according to exemplary embodiments of the inventive concept provide a display device, which is configured to allow for an easy examination of a bonding state between a driving electrode and a side electrode, which are bonded by an adhesive member. The exemplary embodiments of the inventive concept provide a display device configured to have a reduced non-display region or an enlarged display region.

Additional features of the inventive concepts will be set forth in the description which follows, and in part will be apparent from the description, or may be learned by practice of the inventive concepts.

According to exemplary embodiments, a display device includes a display panel comprising a first substrate, a second substrate provided on the first substrate, and side electrodes provided on a side surface of the first substrate and a side surface of the second substrate aligned to the side surface of the first substrate; a driver unit comprising a circuit board, driving electrodes provided on the circuit board to face the side electrodes, and driving signal lines provided on the circuit board, the driving signal lines are connected to the driving electrodes, respectively; and an adhesive member provided between the side electrodes and the circuit board, the adhesive member comprising: a first adhesive portion configured to adhere and electrically connect a first driving electrode of the driving electrodes to a first side electrode of the side electrodes; and a second adhesive portion configured to adhere the circuit board to the first side electrode.

When viewed in a plan view of the circuit board, the circuit board may include: a first region on which the first driving electrode is provided; a second region not overlapped with the first driving electrode; and a bending region connecting the first region to the second region.

The second region may include an inspection region attached to the first side electrode by the second adhesive portion, and wherein a first signal line of the driving signal lines connected to the first driving electrode may be not overlapped with the inspection region, when viewed in a plan view of the circuit board.

At least a portion of the first signal line may include a bending portion provided to bypass the inspection region.

The first adhesive portion and the second adhesive portion may be connected to each other to form a single continuous structure.

The first adhesive portion may be overlapped with the side surface of the second substrate, and wherein the second adhesive portion may be overlapped with the side surface of the first substrate.

The first driving electrode may be not overlapped with the side surface of the first substrate.

The first adhesive portion may be overlapped with the side surface of the first substrate, and wherein the second adhesive portion may be overlapped with the side surface of the second substrate.

The first driving electrode may be not overlapped with the side surface of the second substrate.

A second driving electrode, which is another of the driving electrodes, may be overlapped with the side surface of the first substrate and the side surface of the second substrate, respectively.

When viewed in a plan view of the circuit board, the circuit board may include: a first region, on which the first driving electrode is provided; a second region not overlapped with the first driving electrode; and a third region spaced apart from the second region with the first region interposed therebetween, the third region may be not overlapped with the first driving electrode.

The second adhesive portion may be configured to connect the second region to the first side electrode, and wherein the adhesive member further may include a third adhesive portion configured to attach the third region to the first side electrode.

The circuit board may further include a first bending region connecting the first region to the second region and a second bending region connecting the first region to the third region.

The second region may include a first inspection region, which is attached to the first side electrode by the second adhesive portion, the third region may include a second inspection region, which is attached to the first side electrode by the third adhesive portion, and when viewed in a plan view of the circuit board, a first signal line of the signal lines connected to the first driving electrode may be not overlapped with the first inspection region and the second inspection region.

At least a portion of the first signal line may include a bending portion provided to bypass the second inspection region.

The circuit board may include a first region and a second region, which are overlapped with the first adhesive portion and the second adhesive portion, respectively, when viewed in a plan view of the circuit board, and wherein the first region and the second region may have a height difference.

The driver unit may include driver units.

According to exemplary embodiments, a display device includes: a display panel including a first substrate, a second substrate provided on the first substrate, and side electrodes provided on a side surface of the first substrate and a side surface of the second substrate aligned to the side surface of the first substrate; a driver unit including a circuit board, driving electrodes provided on the circuit board and are respectively overlapped with the side surface of the first substrate and the side surface of the second substrate, and driving signal lines provided on the circuit board, the driving signal lines are connected to the driving electrodes, respectively; and an adhesive member provided between the side electrodes and the circuit board, wherein the circuit board includes: a first region on which the driving electrodes are provided; and a second region on which the driving electrodes are not provided, and wherein the adhesive member is configured to: adhere and electrically connect the driving electrodes disposed on the first region to first sub-side electrodes of the side electrodes; and adhere the second region to second sub-side electrodes of the side electrodes.

The second region may be provided at both end portions of the first region.

The display device may include plural first regions, wherein the second region may be provided between the first regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 1:
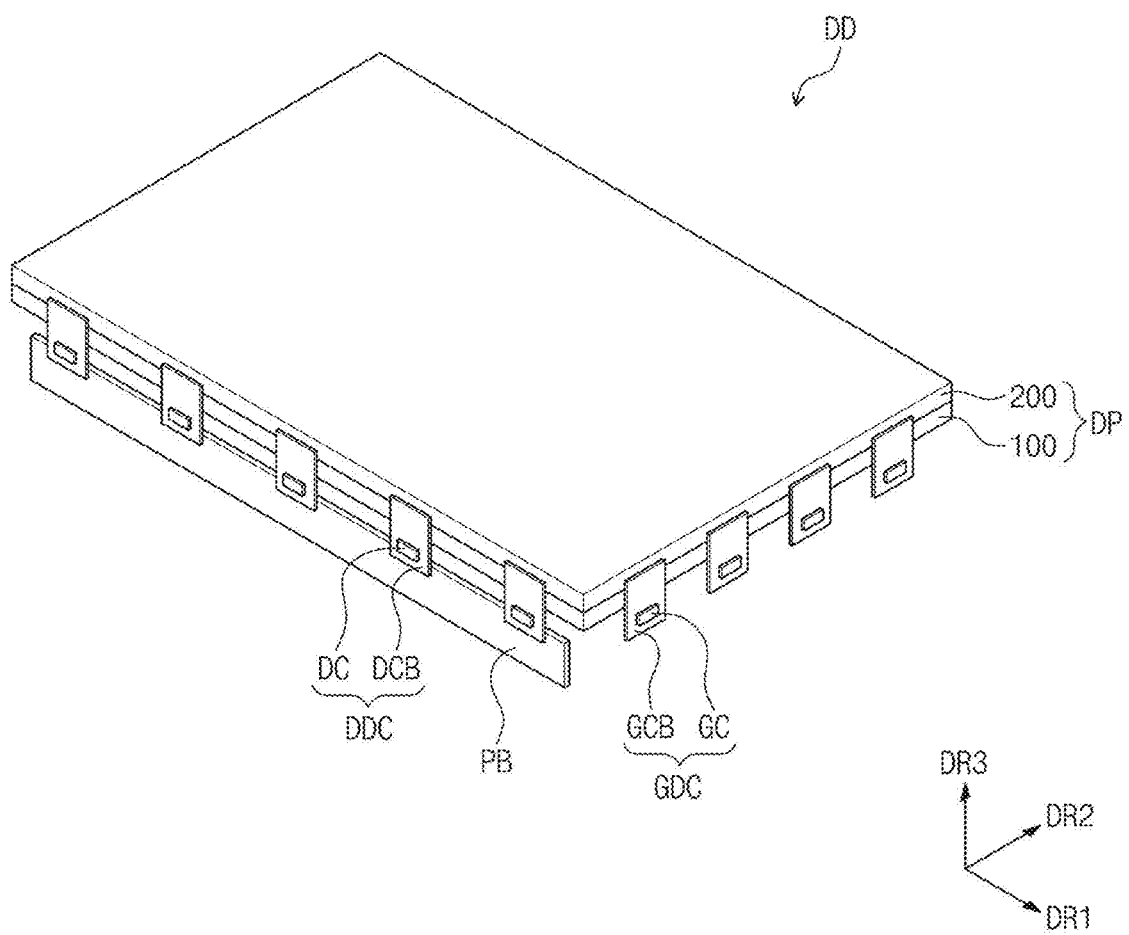
FIG. 1 is a perspective view of a display device according to an exemplary embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the inventive concept will now be described more fully with reference to the accompanying drawings, in which exemplary embodiments are shown. Exemplary embodiments of the inventive concept may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description may be omitted.

Unless otherwise defined, all terms (including technical and scientific terms) used herein have the same meaning as commonly understood by one of ordinary skill in the art to which exemplary embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
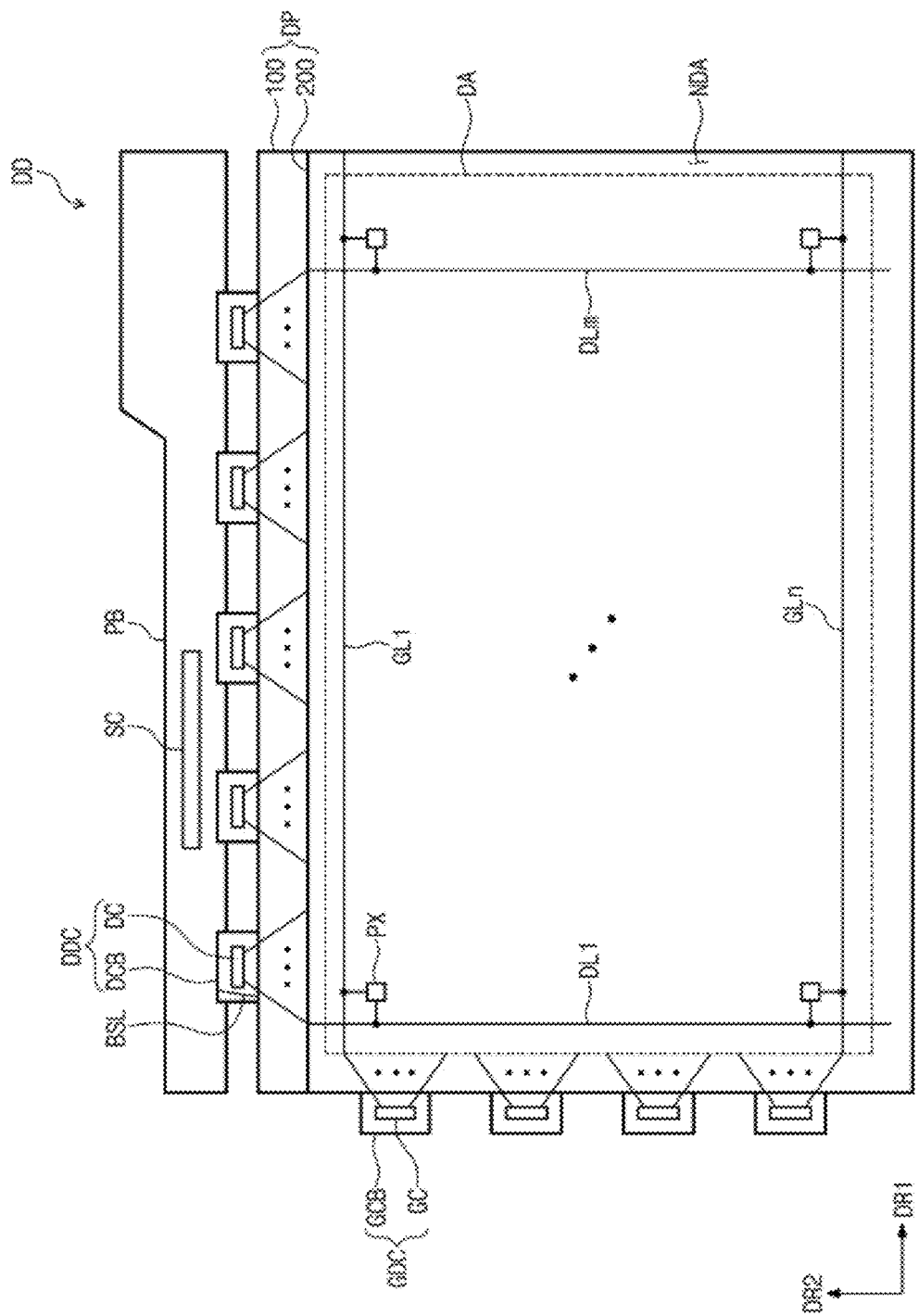
FIG. 2 is a plan view of a display device according to an exemplary embodiment.
Figure 3:
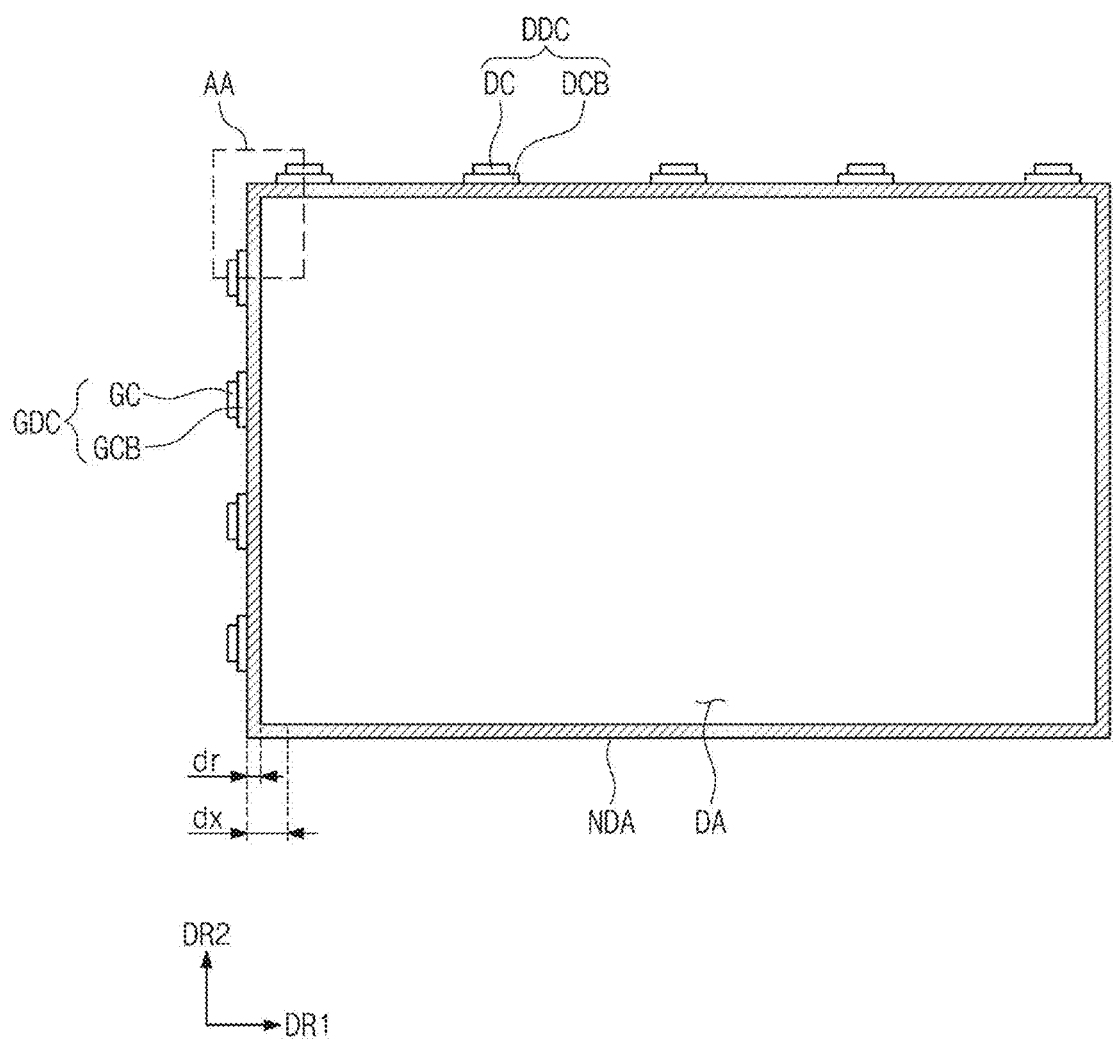
FIG. 3 is a plan view of a display panel according to an exemplary embodiment.

FIG. 1 is a perspective view of a display device according to an exemplary embodiment. FIG. 2 is a plan view of a display device according to an exemplary embodiment. FIG. 3 is a plan view of a display panel according to an exemplary embodiment.

Referring to FIGS. 1 and 2, a display device DD may include a display panel DP, a main circuit board PB, a gate driver unit GDC, a data driver unit DDC, and a signal control unit SC.

In exemplary embodiments, the display device DD may be provided in the form of a medium or large sized electronic device (e.g., notebook computers and television sets) or a small-sized electronic device (e.g., mobile phones, tablets, game machines, and smart watches).

In exemplary embodiments, the display panel DP may be one of an organic light emitting display panel, a liquid crystal display panel, a plasma display panel, an electrophoretic display panel, a microelectromechanical system (MEMS) display panel, and an electrowetting display panel.

The display panel DP may include a first substrate 100 and a second substrate 200, which are provided to face each other. The first and second substrates 100 and 200 may be provided in the form of a glass or plastic substrate, but the exemplary embodiments are not limited thereto. For example, at least one of the first and second substrates 100 and 200 may be formed of or include a flexible or foldable material.

In the case where the display panel DP is the liquid crystal display panel, the display panel DP may include a liquid crystal layer provided between the first and second substrates 100 and 200. In the case where the display panel DP is an organic electric field light-emitting display panel, the display panel DP may include a circuit layer, which is provided on the first substrate 100 and includes a plurality of light emitting devices. In this case, the second substrate 200 may be provided in the form of an encapsulation substrate or a thin-film encapsulation layer. Furthermore, although not shown, an input sensing unit, which is used to sense an external input, may be provided on the display panel DP. The external input may be, for example, a touch event.

The display panel DP may be provided to be parallel to both of a first direction DR1 and a second direction DR2. A normal direction of the display panel DP may be referred to as a third direction DR3. For example, the third direction DR3 may be parallel to a thickness direction of the display device DD. A front or top surface and a rear or bottom surface of each member may be distinguished, based on the third direction DR3. However, directions indicated by the first, second, and third directions DR1, DR2, and DR3 may be relative concept, and in certain embodiments, they may be changed to indicate other directions.

Referring to FIG. 2, the first substrate 100 may include a plurality of gate lines GL1-GLn and a plurality of data lines DL1-DLm, which are provided to cross the gate lines GL1-GLn. In addition, the first substrate 100 may include a plurality of pixels PX connected to the gate lines GL1-GLn and the data lines DL1-DLm. The gate lines GL1-GLn may be connected to the gate driver unit GDC. The data lines DL1-DLm may be connected to the data driver unit DDC.

In order to reduce complexity in the drawings, some of the gate lines GL1-GLn and some of the data lines DL1-DLm are illustrated in FIG. 2. Similarly, some of the pixels PX are illustrated in FIG. 2. Each of the pixels PX may be connected to a corresponding one of the gate lines GL1-GLn and a corresponding one of the data lines DL1-DLm.

The pixels PX may be classified into a plurality of groups, each of which is configured to display a specific color. Each of the pixels PX may be configured to display one of primary colors. The primary colors may include red, green, blue, and white, but the exemplary embodiments are not limited thereto. For example, the primary colors may further include various other colors such as yellow, cyan, and magenta.

The signal control unit SC may be mounted on the main circuit board PB, but the exemplary embodiments are not limited thereto. For example, the signal control unit SC may be mounted on an external circuit board. In this case, the external circuit board may be electrically connected to the main circuit board PB.

The signal control unit SC may be configured to receive image data and control signals from an external graphic control unit. The control signals may include a vertical synchronization signal as a frame distinction signal, a horizontal synchronization signal as a row distinction signal, a data enable signal to indicate a data input period (e.g., data enable signal is maintained at a high level when data are available), and a clock signal, but the exemplary embodiments are not limited thereto. For example, the control signals may further include a plurality of signals, which are used to operate the gate driver unit GDC and the data driver unit DDC.

The signal control unit SC may be configured to produce a gate control signal for controlling the gate driver circuit GDC, in response to the control signal, and then to provide the gate control signal to the gate driver circuit GDC. The signal control unit SC may also be configured to produce a data control signal for controlling the data driver unit DDC and then to provide the data control signal to the data driver unit DDC.

In exemplary embodiments, a plurality of the gate driver units GDC may be provided to produce gate signals, based on the gate control signal, during each frame period. The gate driver unit GDC may also be configured to output the gate signals to the gate lines GL1-GLn. The gate signals may be sequentially output in a manner corresponding to the horizontal periods. Furthermore, although not shown, a plurality of gate circuit boards GCB may be electrically connected to each other.

For the sake of simplicity, the description that follows will refer to an example in which a plurality of the gate driver units GDC are provided, but the exemplary embodiments are not limited thereto. For example, the gate driver unit GDC may be a single gate driver unit which is configured to produce the gate signals. The display device DD with the single gate driver unit may be used to realize, for example, a mobile phone.

The gate driver unit GDC may include a gate circuit board GCB and a gate driving chip GC, which is mounted on the gate circuit board GCB. As an example, the gate circuit board GCB may be provided in the form of a flexible circuit board, and the gate circuit board GCB may be provided in the same number as that of the gate driving chip GC.

In exemplary embodiments, the gate driver unit GDC may be provided on side surfaces of the first and second substrates 100 and 200, which are aligned to each other. The gate driver unit GDC may be electrically connected to the gate lines GL1-GLn and may be used to provide the gate signals to the gate lines GL1-GLn.

In exemplary embodiments, the gate driver unit GDC and the data driver unit DDC may be provided in the form of a tape carrier package (TCP).

According to a comparable embodiment in which a pad portion of the gate circuit board GCB is provided on a region of the first substrate 100 on a top surface of the display panel DP overlapped with a non-display region NDA, the top surface of the display panel DP should include a pad region for the pad portion of the gate circuit board GCB. In other words, an area of the non-display region should be increased by an area of the pad region for the pad portion.

According to exemplary embodiments, since the gate circuit board GCB is provided on one of the side surfaces of the display panel DP, there is no need to provide the pad portion of the gate circuit board GCB on the top surface of the first substrate 100. In the case where the circuit board is provided on the top surface of the display panel DP, the non-display region NDA of the display panel DP may include a first region dx, on which the pad portion of the gate circuit board GCB is disposed. That is, when measured in the first direction DR1, an area of the non-display region NDA may be increased by that of the first region dx. By contrast, according to exemplary embodiments, since the pad portion of the gate circuit board GCB is not provided in the non-display region NDA of the display panel DP, it may be possible to reduce a length of the non-display region NDA by a difference between lengths of the first and second regions dx and dr, when measured in the first direction DR1.

Since, as described above, the gate circuit board GCB is provided on the side surface of the display panel DP, it may be possible to reduce an area of a region to be used for the non-display region NDA. Thus, it may be possible to increase an area for a display region DA of the display panel DP. The display region DA and the non-display region NDA may be substantially distinguished by an image-displaying surface (i.e., a top surface) of a substrate, not by the side surface of the display panel DP. Thus, in the case where an area of the non-display region NDA is reduced without a change in the total area of a display panel, it may be possible to increase an area of the display region DA for displaying an image.

As described above, the gate driver unit GDC may be provided in the form of a tape carrier package (TCP) and may be connected to the display panel DP, but the exemplary embodiments are not limited thereto. For example, the gate driver unit GDC may be directly provided in the display panel DP.

A plurality of the data driver units DDC may be provided. The data driver unit DDC may be configured to generate gradation voltages on the basis of a data control signal provided from the signal control unit SC, and here, the gradation voltages may be determined based on image data provided from the signal control unit SC. The gradation voltages may constitute data signals, which are output from the data driver unit DDC to the data lines DL1-DLm.

In exemplary embodiments, a plurality of the data driver units DDC may be provided, but the exemplary embodiments are not limited thereto. For example, the data driver unit DDC may be provided in the form of a single data driver unit and may be used to generate gradation voltages. The display device DD with the single data driver unit may be used to realize, for example, a mobile phone.

The data driver unit DDC may include a data circuit board DCB and a data driving chip DC, which is mounted on the data circuit board DCB. In exemplary embodiments, the data circuit board DCB may be provided in the form of a flexible circuit board. The data circuit board DCB may be configured to electrically connect the main circuit board PB to the first substrate 100. A plurality of the driving chips DC may provide corresponding data signals to corresponding lines of the data lines DL1-DLm.

In exemplary embodiments, the data driver unit DDC may be provided on other side surfaces of the first and second substrates 100 and 200, which are aligned to each other. Since the data driver unit DDC is provided on the side surface of the display panel DP, not on a top surface of the substrate of the display panel DP, it may be possible to increase an effective area of the display region DA of the display panel DP.

In exemplary embodiments, the gate control signal output from the signal control unit SC may be provided to the gate circuit board GCB via one of the data circuit boards, which is located closest to the gate circuit board GCB. To this end, a substrate dummy line BSL may be provided in the data circuit board DCB to deliver the gate control signal from the signal control unit SC to the gate circuit board GCB.

Figure 4:
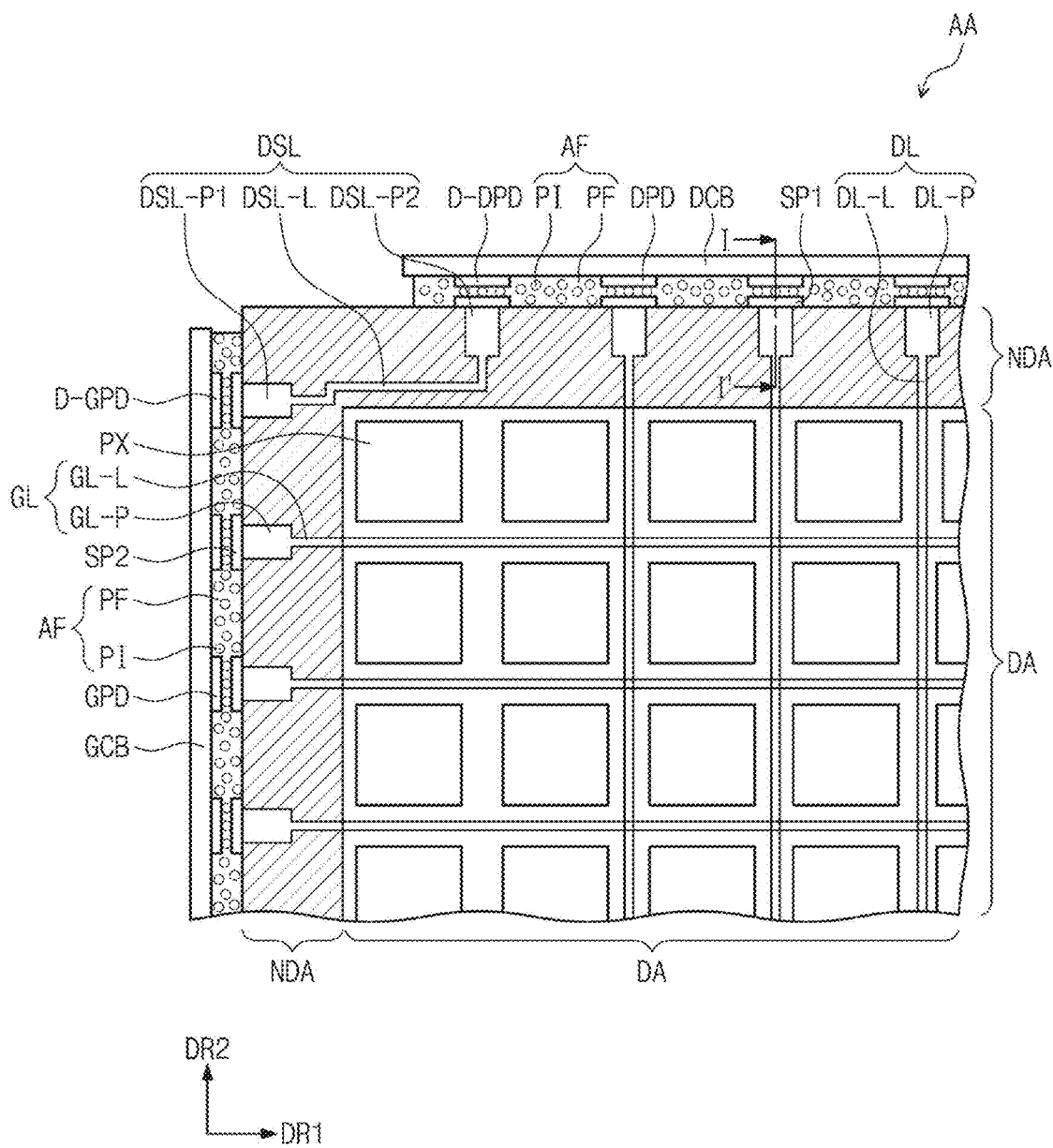
FIG. 4 is an enlarged plan view of a region AA illustrated in FIG. 3.

FIG. 4 is an enlarged plan view illustrating a region 'AA' of FIG. 3.

For convenience in illustration, FIG. 4 illustrates one of the gate driver units GDC and one of the data driver units DDC connected to the display panel DP of FIG. 2. In addition, the gate driving chip GC and the data driving chip DC, which are respectively mounted on the gate circuit board GCB and the data circuit board DCB, are not illustrated in FIG. 4.

In detail, referring to FIG. 4, the display panel DP may include a plurality of signal lines, which are overlapped with the display region DA and the non-display region NDA. Here, the signal lines may include data lines DL, gate lines GL, and a dummy line DSL.

Each of the data lines DL may include a data pad portion DL-P and a data line portion DL-L. The data line portion DL-L may be overlapped with the display region DA and the non-display region NDA. The data pad portion DL-P may be overlapped with the non-display region NDA and may be connected to an end portion of the data line portion DL-L.

The dummy line DSL may be overlapped with the non-display region NDA and may include a gate dummy pad portion DSL-P1, a data dummy pad portion DSL-P2, and a dummy line portion DSL-L connecting the gate dummy pad portion DSL-P1 to the data dummy pad portion DSL-P2. The gate dummy pad portion DSL-P1 may be connected to an end portion of the dummy line portion DSL-L, and the data dummy pad portion DSL-P2 may be connected to an opposite end portion of the dummy line portion DSL-L. The data dummy pad portion DSL-P2 may be located closer to the gate circuit board GCB than the data pad portion DL-P. For convenience in description, only one dummy line DSL is illustrated, but in certain embodiments, a plurality of the dummy lines DSL may be provided.

The dummy line DSL may be electrically connected to the substrate dummy line BSL (referring back to FIG. 2), which is provided in the data circuit board DCB. Thus, the dummy line DSL may be used to deliver the gate control signal, which is provided through the substrate dummy line BSL, to the gate circuit board GCB. The gate driving chip GC provided on the gate circuit board GCB may be configured to output corresponding gate signals to the gate lines GL, in response to the gate control signal, which is provided through the dummy line DSL.

Each of the gate lines GL may include a gate pad portion GL-P and a gate line portion GL-L. The gate line portion GL-L may be overlapped with the display region DA and the non-display region NDA. The gate pad portion GL-P may be overlapped with the non-display region NDA and may be connected to an end portion of the gate line portion GL-L.

As shown in FIG. 4, the data driver unit DDC may further include a plurality of data driving electrodes DPD and a first dummy driving electrode D-DPD, in addition to the data circuit board DCB and the data driving chip DC described above. The number of the data driving electrodes DPD may correspond to the number of the data lines DL. The description that follows will refer to an example in which the data driver unit DDC is provided on a first side surface that is one of the side surfaces of the display panel DP.

The data driving electrodes DPD may be electrically connected to the data lines DL, respectively. The data driving electrodes DPD may receive respective data voltages from the data driving chip DC. The first dummy driving electrode D-DPD may be electrically connected to the dummy line DSL and may be used to receive the gate control signal from the signal control unit SC. In other words, the gate control signal may be transmitted to the dummy line DSL through the first dummy driving electrode D-DPD.

The gate driver unit GDC may further include a plurality of gate driving electrodes GPD and a second dummy driving electrode D-GPD, in addition to the gate circuit board GCB and the gate driving chip GC described above. The number of the gate driving electrodes GPD may correspond to the number of the gate lines GL. The description that follows will refer to an example in which the gate driver unit GDC is provided on a second side surface that is one of the side surfaces of the display panel DP.

The gate driving electrodes GPD may be electrically connected to the gate lines GL, respectively. The gate driving electrodes GPD may receive respective gate signals from the gate driving chip GC. The second dummy driving electrode D-GPD may be electrically connected to the dummy line DSL and may be used to receive the gate control signal. The second dummy driving electrode D-GPD may be electrically connected to the gate driving chip GC. The gate driving chip GC may receive the gate control signal through the second dummy driving electrode D-GPD and may output corresponding gate signals to the gate driving electrodes GPD in response to the gate control signal.

In exemplary embodiments, the display panel DP may further include a plurality of first side electrodes SP1, each of which is provided on another side surfaces of the first and second substrates 100 and 200. Each of the first side electrodes SP1 may be provided to face the first dummy driving electrode D-DPD or a corresponding one of the data driving electrodes DPD. Furthermore, the display panel DP may further include a plurality of second side electrodes SP2, each of which is provided on the side surfaces of the first and second substrates 100 and 200. Each of the second side electrodes SP2 may be provided to face the second dummy driving electrode D-GPD or a corresponding one of the gate driving electrodes GPD.

A first adhesive member AF may be provided between the first side electrodes SP1 and the data circuit board DCB. In exemplary embodiments, the first adhesive member AF may be provided in the form of an anisotropic conductive film. For example, the first adhesive member AF may include an adhesive film PF having an adhesive property and conductive particles PI formed in the adhesive film PF. The conductive particles PI may allow the first side electrodes SP1 to be electrically connected to the first dummy driving electrode D-DPD and the data driving electrodes DPD, respectively.

A second adhesive member AF may be provided between the second side electrodes SP2 and the gate circuit board GCB. In exemplary embodiments, the second adhesive member AF may be provided in the form of an anisotropic conductive film. For example, the second adhesive member AF may include an adhesive film PF having an adhesive property and conductive particles PI formed in the adhesive film PF. The conductive particles PI may allow the second side electrodes SP2 to be electrically connected to the second dummy driving electrode D-GPD and the gate driving electrodes GPD, respectively.

Figure 5:
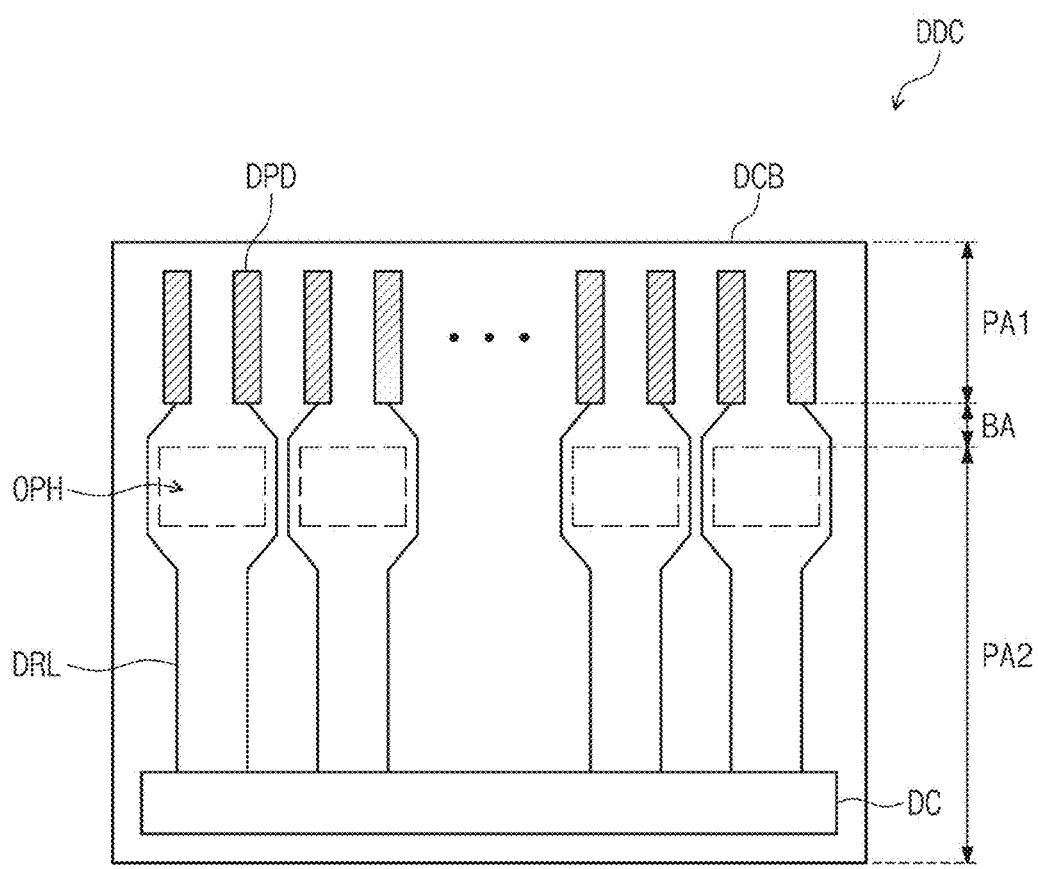
FIG. 5 is a plan view of a data driver unit according to an exemplary embodiment.
Figure 6:
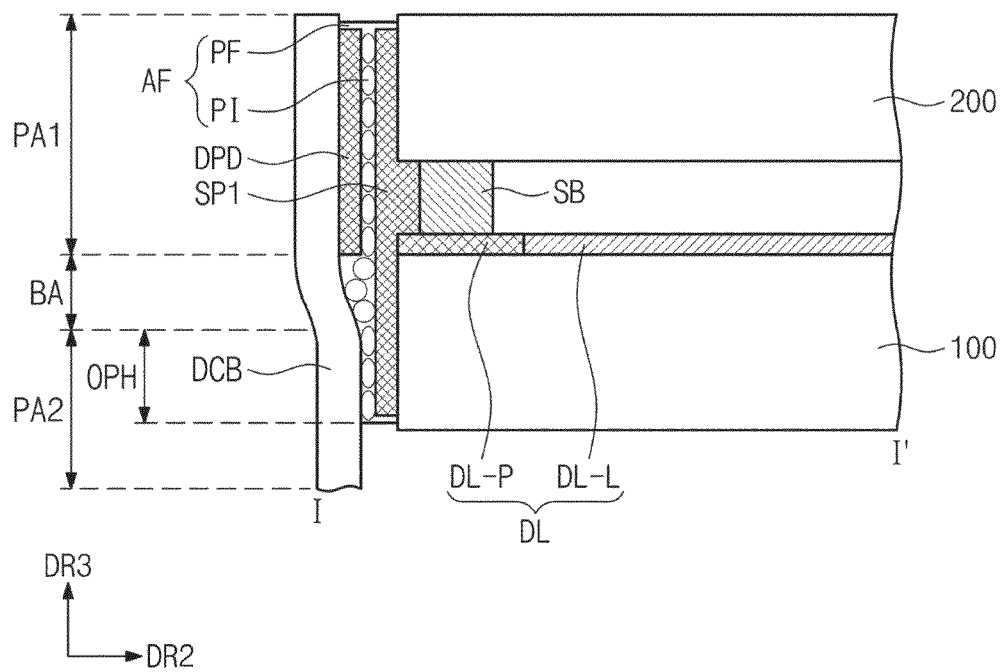
FIG. 6 is a cross-section drawing of a display panel according to an exemplary embodiment, taken along a sectional line I-I' of FIG. 4.
Figure 7:
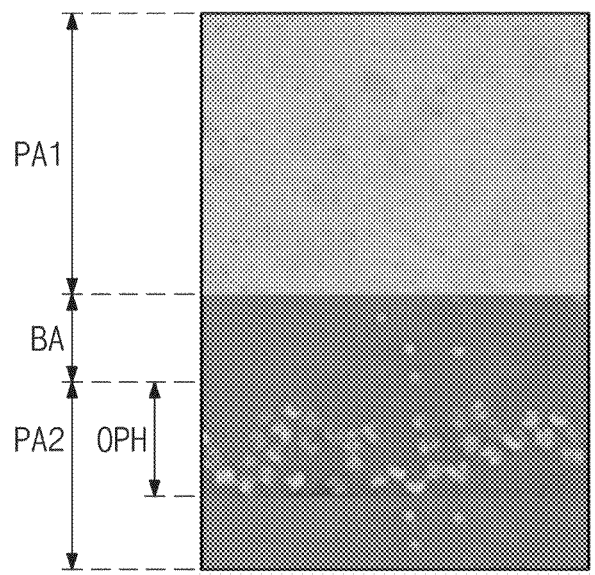
FIG. 7 is an image showing driving and side electrodes that are bonded to each other by an adhesive member according to an exemplary embodiment.

FIG. 5 is a plan view of a data driver unit according to an exemplary embodiment. FIG. 6 is a cross-section drawing of a display panel according to an exemplary embodiment, taken along line a sectional I-I' of FIG. 4. FIG. 7 is an image showing driving and side electrodes that are bonded to each other by an adhesive member according to an exemplary embodiment.

A structure of the data driver unit DDC will be described with reference to FIGS. 5, 6, and 7, but the exemplary embodiments are not limited thereto. For example, the gate driver unit GDC may have substantially the same structure as that described with reference to FIGS. 5, 6, and 7.

Referring to FIGS. 5 and 6, the data driver unit DDC may include the data circuit board DCB, the data driving electrodes DPD, the data driving chip DC, and driving signal lines DRL. When viewed in a plan view of the circuit board, the data circuit board DCB may include a first region PA1, a second region PA2, and a bending region BA connecting the first region PA1 to the second region PA2.

The data driving electrodes DPD may be provided in the first region PA1. The driving signal lines DRL may be provided in the second region PA2 and the bending region BA. The data driving chip DC may be provided in the second region PA2.

For convenience in description, a connection structure between the first data driving electrode of the data driving electrodes DPD and the first side electrode of the first side electrodes SP1, which are provided to face each other, will be described below.

The adhesive member AF may be used to adhere and electrically connect the first data driving electrode DPD, which is provided on the first region PA1 of the data circuit board DCB, to the first side electrode SP1. Furthermore, the adhesive member AF may be used to adhere the second region PA2, which is overlapped with an inspection region OPH, to the first side electrode SP1.

For the sake of simplicity, the description that follows will refer to an example in which the adhesive member AF includes a first adhesive portion, a second adhesive portion, and a connection adhesive portion connecting the first adhesive portion to the second adhesive portion. The first adhesive portion may be used to adhere and electrically connect the first data driving electrode DPD to the first side electrode SP1. The second adhesive portion may be used to adhere the data circuit board DCB to the first side electrode SP1. The connection adhesive portion may be overlapped with the bending region BA of the data circuit board DCB.

According to exemplary embodiments, in the second direction DR2, the first adhesive portion may be overlapped with a side surface of the second substrate 200. In the second direction DR2, the second adhesive portion may be overlapped with a side surface of the first substrate 100. Here, the second direction DR2 may be a direction that is perpendicular to a thickness direction of the first substrate 100 or the second substrate 200.

The first adhesive portion, the second adhesive portion, and the connection adhesive portion, which are included in the adhesive member AF, may be connected to each other thereby forming a single continuous structure. In exemplary embodiments, the number of the adhesive member AF may correspond to the number of the first side electrodes SP1. In other words, the first region PA1 of the data circuit board DCB may be overlapped with the side surface of the second substrate 200, and the second region PA2 may be overlapped with the side surface of the first substrate 100.

In exemplary embodiments, the second region PA2 may include the inspection region OPH, which is attached to the first side electrode SP1 by the second adhesive portion. According to exemplary embodiments, the inspection region OPH may be configured to allow for inspection of a bonding state between the first data driving electrode DPD and the first side electrode SP1. For example, an imprint state between the second region PA2, which is overlapped with the inspection region OPH, and the first side electrode SP1 may be used to provide information on a bonding state between the first data driving electrode DPD and the first side electrode SP1.

For example, the imprint state between the second region PA2 overlapped with the inspection region OPH and the first side electrode SP1 may be examined by an optical inspection process, in which an external optical system is used. The conductive particles PI may be provided between the first data driving electrode DPD and the first side electrode SP1 in a compressed state to electrically connect the first data driving electrode DPD to the first side electrode SP1.

Since the first data driving electrode DPD is formed of a metallic material, light cannot pass through the first data driving electrode DPD. Thus, as shown in FIG. 7, it may be difficult to examine an imprint state of the conductive particles PI electrically connecting the first data driving electrode DPD to the first side electrode SP1, through the optical inspection process. That is, by examining an imprint state of the conductive particles PI through the optical inspection process, it may be hard to checking an electric bonding state between two elements.

In exemplary embodiments, a metallic material may be not provided in the second region PA2 overlapped with the inspection region OPH. For example, the inspection region OPH may be not overlapped with the first data driving electrode DPD and the driving signal line DRL. As an example, the second region PA2 may be formed of a transparent material (e.g., polyimide). Thus, as shown in FIG. 7, it may be possible to inspect an imprint state of the conductive particles PI connecting the second region PA2, which is overlapped with the inspection region OPH, to the first side electrode SP1. As a result, by inspecting an imprint state of the conductive particles PI connecting the second region PA2, which is overlapped with the inspection region OPH, to the first side electrode SP1, it may be possible to obtain information on a bonding state between the first data driving electrode DPD and the first side electrode SP1.

In exemplary embodiments, the driving signal line DRL may be not overlapped with the inspection region OPH and may include a bending portion, which is provided to bypass the inspection region OPH. In other words, the data driving chip DC may be located closer to the inspection region OPH than the first data driving electrode DPD.

As shown in FIG. 6, the data line DL may be provided on the first substrate 100. For example, the data pad portion DL-P of the data line DL may be in contact with the first side electrode SP1. In addition, a sealing member SB may be provided between the first and second substrates 100 and 200 to connect the first and second substrates 100 and 200 to each other. In certain embodiments, the sealing member SB may be omitted.

Figure 8:
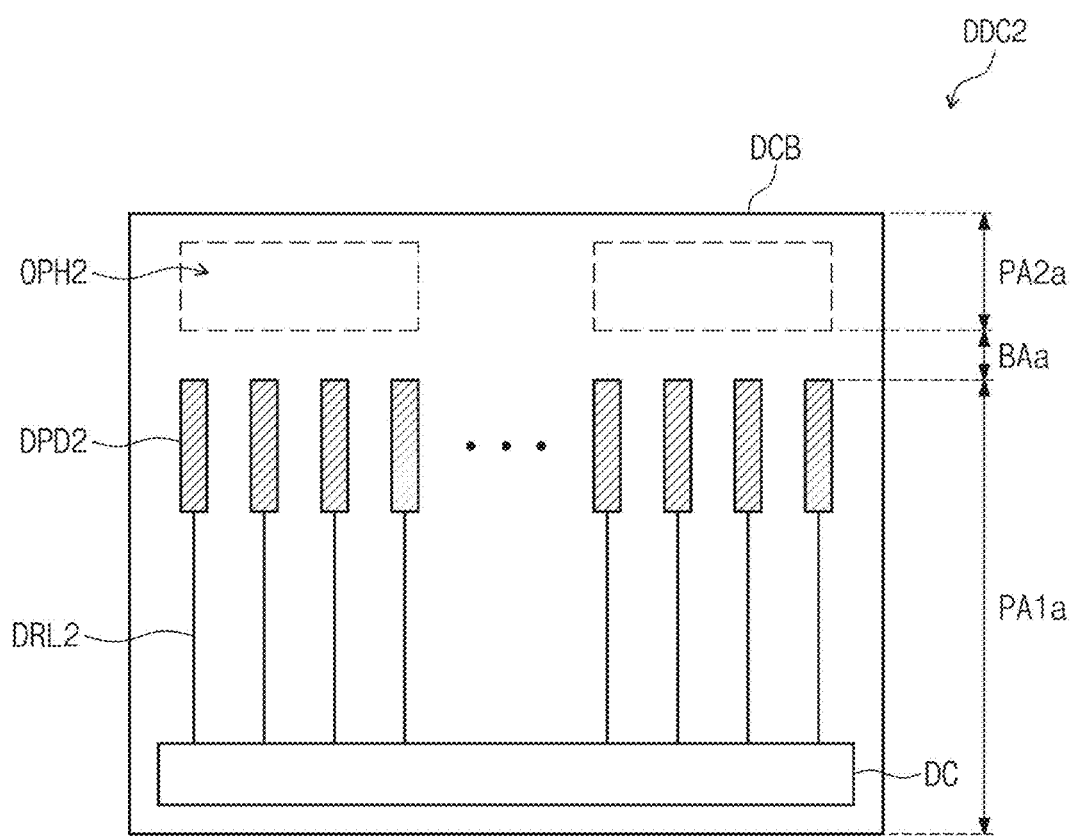
FIG. 8 is a plan view of a data driver unit according to an exemplary embodiment.
Figure 9:
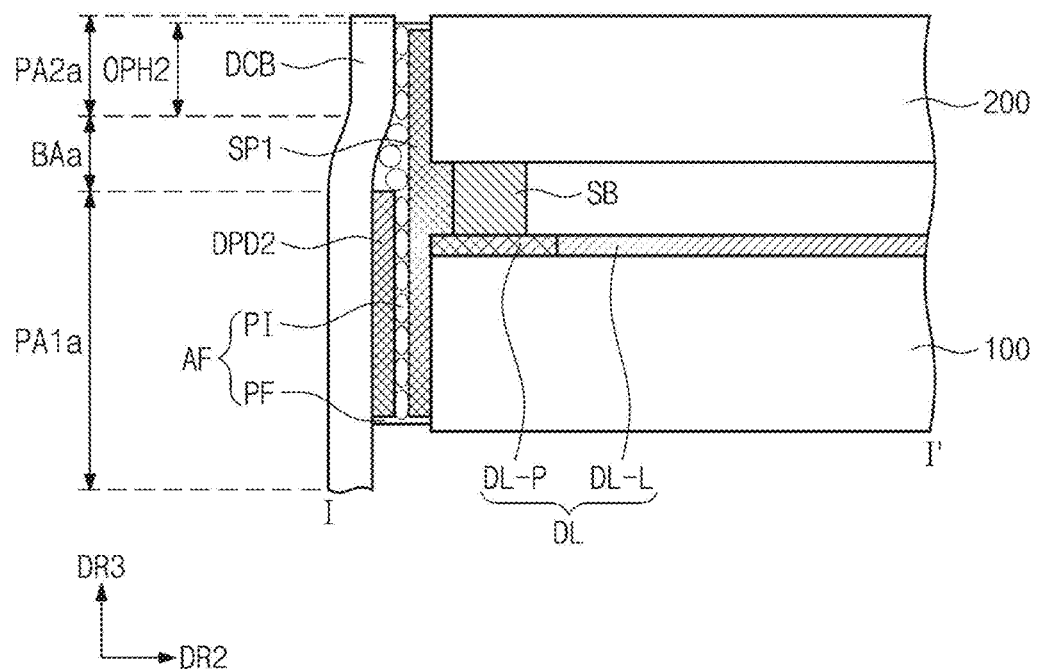
FIG. 9 is a cross-section view of a display panel according to an exemplary embodiment, taken along a sectional line I-I' of FIG. 4.

FIG. 8 is a plan view of a data driver unit according to an exemplary embodiment. FIG. 9 is a cross-section view illustrating a display panel according to an exemplary embodiment, taken along a sectional line I-I' of FIG. 4.

Referring to FIGS. 8 and 9, a data driver unit DDC2 may include data driving electrodes DPD2, and driving signal lines DRL2, in addition to the data circuit board DCB and the data driving chip DC described above.

When viewed in a plan view of the circuit board, the data circuit board DCB may include a first region PA1a, a second region PA2a, and a bending region BAa connecting the first region PA1a to the second region PA2a.

The data driving electrodes DPD2, the driving signal lines DRL2, and the data driving chip DC may be provided on the first region PA1a. An element containing a metallic material may be not provided on the second region PA2a. In other words, an inspection region OPH2 included in the second region PA2a may be used to inspect an imprint state between the data driving electrodes DPD2 and the first side electrodes SP1.

For convenience in description, a connection structure between the first data driving electrode of the data driving electrodes DPD2 and the first side electrode of the first side electrodes SP1, which are provided to face each other, will be described below.

The adhesive member AF may be used to adhere and electrically connect the first data driving electrode DPD2, which is provided on the first region PA1a of the data circuit board DCB, to the first side electrode SP1. Furthermore, the adhesive member AF may be used to adhere the second region PA2a, which is overlapped with the inspection region OPH2, to the first side electrode SP1.

For the sake of simplicity, the description that follows will refer to an example in which the adhesive member AF includes a first adhesive portion, a second adhesive portion, and a connection adhesive portion connecting the first adhesive portion to the second adhesive portion. The first adhesive portion may be used to adhere and electrically connect the first data driving electrode DPD2 to the first side electrode SP1. The second adhesive portion may be used to adhere the data circuit board DCB to the first side electrode SP1. The connection adhesive portion may be overlapped with the bending region BA of the data circuit board DCB. The first adhesive portion, the second adhesive portion, and the connection adhesive portion, which are included in the adhesive member AF, may be connected to form a single object. In exemplary embodiments, the number of the adhesive member AF may correspond to the number of the first side electrodes SP1.

In the second direction DR2, the first adhesive portion may be overlapped with a side surface of the first substrate 100. In the second direction DR2, the second adhesive portion may be overlapped with a side surface of the second substrate 200. In other words, the first region PA1a of the data circuit board DCB may be overlapped with the side surface of the first substrate 100, and the second region PA2a may be overlapped with the side surface of the second substrate 200.

In exemplary embodiments, the second region PA2a may include the inspection region OPH2, which is attached to the first side electrode SP1 by the second adhesive portion. The inspection region OPH2 may be configured to allow for inspection of a bonding state between the first data driving electrode DPD2 and the first side electrode SP1. For example, an imprint state between the second region PA2a, which is overlapped with the inspection region OPH2, and the first side electrode SP1 may be used to provide information on a bonding state between the first data driving electrode DPD2 and the first side electrode SP1.

Since the first data driving electrode DPD2 is formed of a metallic material, light cannot pass through the first data driving electrode DPD. Thus, it may be difficult to examine an imprint state of the conductive particles PI electrically connecting the first data driving electrode DPD2 to the first side electrode SP1, through the optical inspection process.

According to exemplary embodiments, a metallic material may be not provided in the second region PA2a overlapped with the inspection region OPH2. Thus, it may be possible to inspect an imprint state of the conductive particles PI connecting the second region PA2a, which is overlapped with the inspection region OPH2, to the first side electrode SP1. As a result, by inspecting an imprint state of the conductive particles PI connecting the second region PA2a, which is overlapped with the inspection region OPH2, to the first side electrode SP1, it may be possible to obtain information on a bonding state between the first data driving electrode DPD2 and the first side electrode SP1.

Furthermore, in exemplary embodiments, the data driving chip DC shown in FIG. 8 may be located closer to the first data driving electrode DPD2 than the inspection region OPH2. That is, the driving signal lines DRL2 may be provided closer to the first data driving electrodes DPD2 than the inspection region OPH2. Thus, the driving signal lines DRL2 may be not overlapped with the inspection region OPH2 and may be used to electrically connect the data driving chip DC to the first data driving electrodes DPD2.

Figure 10:
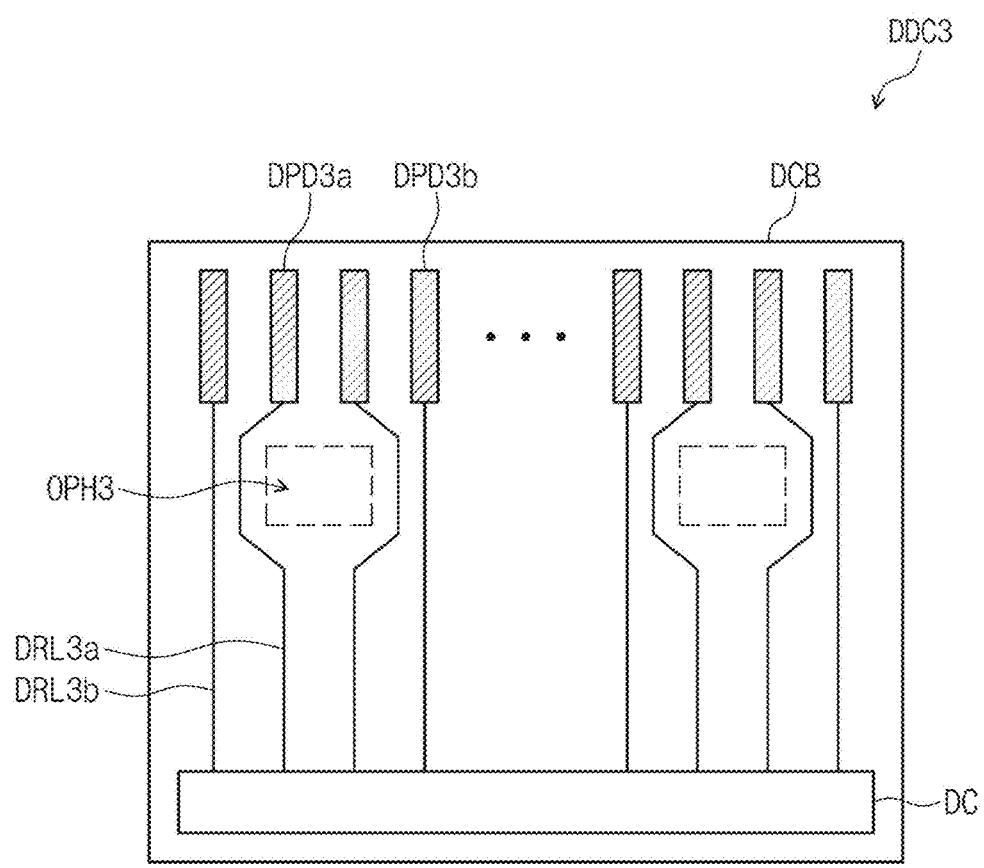
FIG. 10 is a plan view of a data driver unit according to an exemplary embodiment.

FIG. 10 is a plan view illustrating a data driver unit according to an exemplary embodiment. Except for a slight difference in structure of the driving signal lines, a data driver unit DDC3 of FIG. 10 may be configured to have substantially the same structure as that of the data driver unit DDC shown in FIG. 5. Thus, for the sake of brevity, the elements and features of this example that are similar to those previously shown and described will not be described in much further detail.

Referring to FIG. 10, first driving signal lines DRL3a may be provided to have substantially the same structure as the driving signal lines DRL shown in FIG. 5. For example, the first driving signal lines DRL3a may be connected to first data driving electrodes DPD3a, respectively, and here, at least a portion of each of the first driving signal lines DRL3a may be bent in such a way that it is not overlapped with the inspection region OPH3, thereby providing an inspection region OPH3.

Second driving signal lines DRL3b may be geodetically connected to second data driving electrodes DPD3b. The inspection region OPH3 may be not formed by the second driving signal lines DRL3b connected to the second data driving electrodes DPD3b. That is, in the data driver unit DDC3 shown in FIG. 10, the inspection region OPH3 may be defined by some of the driving signal lines connected to the data driving electrodes.

Figure 11:
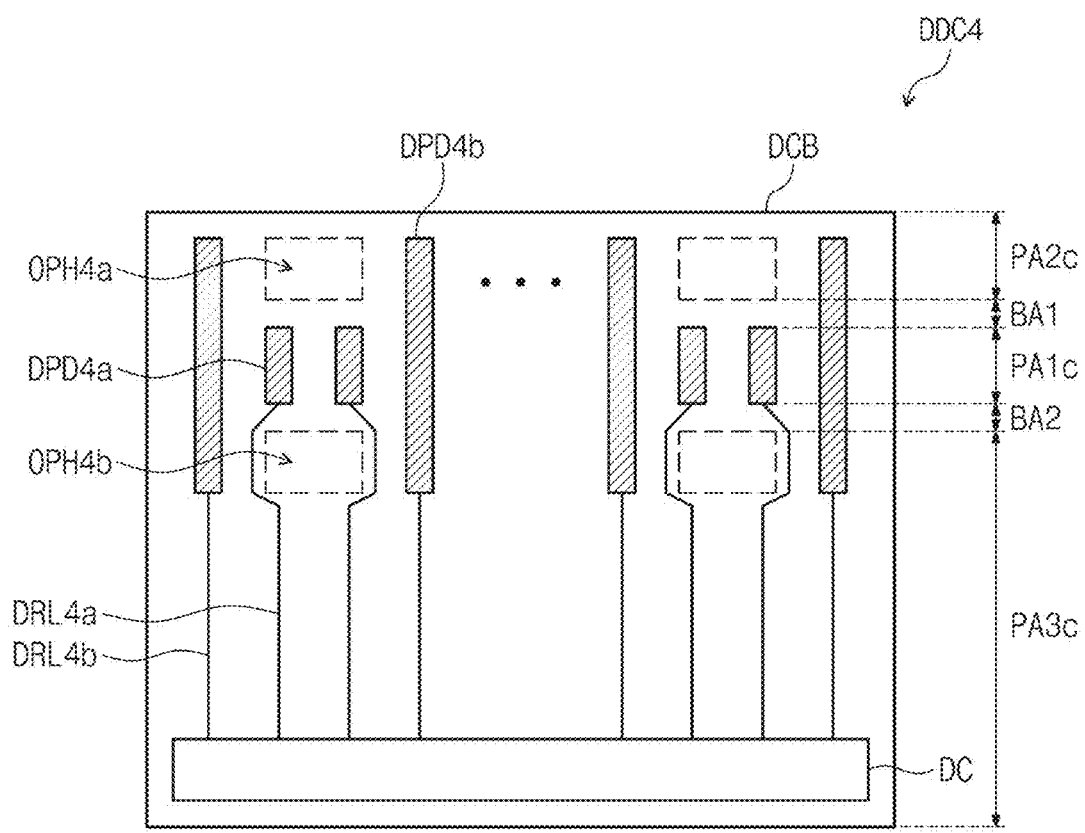
FIG. 11 is a plan view of a data driver unit according to an exemplary embodiment.

FIG. 11 is a plan view illustrating a data driver unit according to an exemplary embodiment. Referring to FIG. 11, a data driver unit DDC4 may include a first data driving electrode DPD4a, a second data driving electrode DPD4b, first driving signal lines DRL4a, and second driving signal lines DRL4b, in addition to the data circuit board DCB and the data driving chip DC described above.

The data circuit board DCB may include first, second, and third regions PA1c, PA2c, and PA3c, a first bending region BA1, and a second bending region BA2, when viewed in a plan view of the circuit board.

The first data driving electrode DPD4a may be provided on the first region PA1c. The second region PA2c may be not overlapped with the first data driving electrode DPD4a. The third region PA3c may be spaced apart from the second region PA2c with the first region PA1c interposed therebetween and may be not overlapped with a first data driving electrode DP4a. The first bending region BA1 may be provided between the first region PA1c and the second region PA2c. The second bending region BA2 may be provided between the first region PA1c and the third region PA3c.

In this case, the adhesive member AF may include a first adhesive portion connecting the first region PA1c to the first side electrode SP1. In addition, the adhesive member AF may include a second adhesive portion, which is provided to connect the second region PA2c to a portion of the first side electrode SP1 overlapped with a side surface of the second substrate 200, and a third adhesive portion, which is provided to connect the third region PA3c to a portion of the first side electrode SP1 overlapped with a side surface of the first substrate 100.

The second region PA2c may include a first inspection region OPH4a, which is attached to the first side electrode SP1 by the second adhesive portion. The third region PA3c may include a second inspection region OPH4b, which is attached to the first side electrode SP1 by the third adhesive portion.

At least a portion of the first driving signal line DRL4a connected to the first data driving electrode DPD4a may include a bending portion, which is provided to bypass the second inspection region OPH4b.

The second data driving electrode DPD4b may be overlapped with a side surface of the first substrate 100 and a side surface of the second substrate 200, respectively. In other words, the second data driving electrode DPD4b may be overlapped with all of the first, second, and third regions PA1c, PA2c, and PA3c, the first bending region BA1, and the second bending region BA2. In certain embodiments, the data driver unit DDC4 may include the first data driving electrode DPD4a but may not include the second data driving electrode DPD4b.

Figure 12:
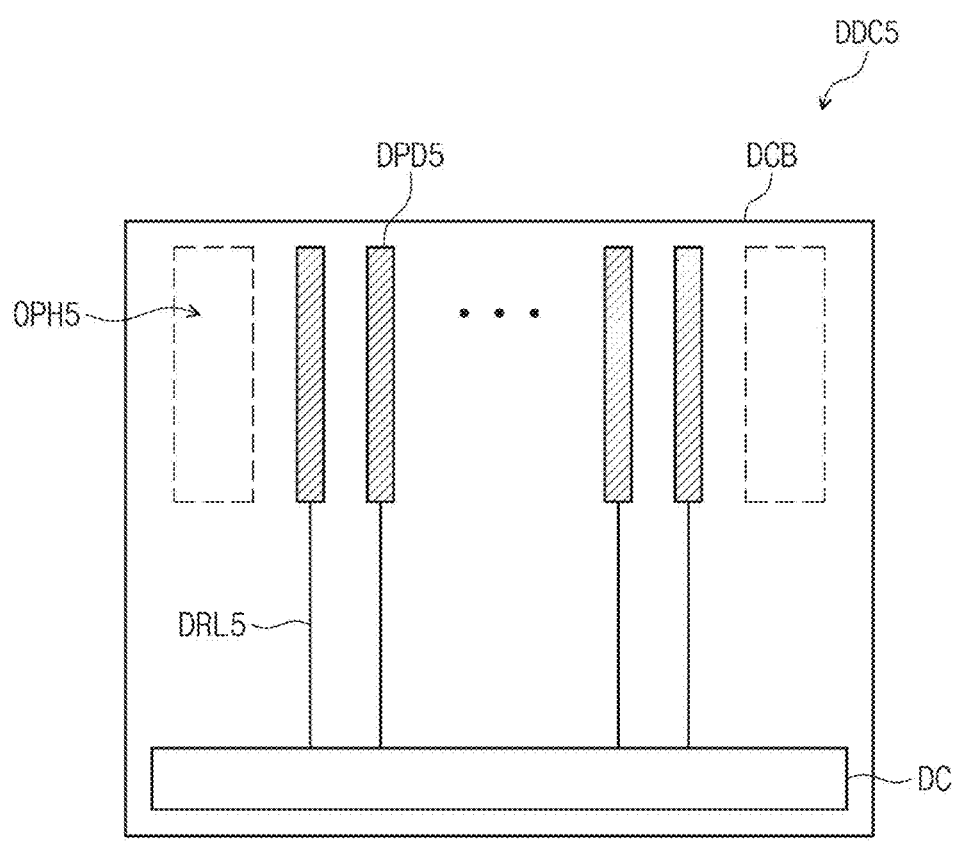
FIG. 12 is a plan view of a data driver unit according to an exemplary embodiment.

FIG. 12 is a plan view illustrating a data driver unit according to an exemplary embodiment.

A data driving electrode DPD5 provided in a data driver unit DDC5 of FIG. 12 may correspond to the second data driving electrode DPD4b described with reference to FIG. 11.

In other words, the data driving electrode DPD5 may be provided on the data circuit board DCB to be overlapped with side surfaces of the first and second substrates 100 and 200 (e.g., see FIG. 5), respectively. In exemplary embodiments, the data circuit board DCB may include a first region, on which the data driving electrode DPD5 is provided, and a second region, on which the data driving electrode DPD5 is not provided.

In exemplary embodiments, the adhesive member AF (e.g., see FIG. 5) may be used to adhere and electrically connect the data driving electrode DPD5, which is provided on the first region, to first sub-side electrodes of the first side electrodes SP1, respectively. Furthermore, the adhesive member AF may be used to adhere the second region to second sub-side electrodes of the first side electrodes SP1.

Furthermore, the second region, which is not overlapped with a driving signal line DRL5 and the data driving electrode DPD5, may include an inspection region OPH5. The inspection region OPH5 may be overlapped with at least one of side surfaces of the first and second substrates 100 and 200.

As an example, the second region including the inspection region OPH5 may be provided at both ends of the data driving electrodes DPD5. In other words, the second region may be provided at both ends of the first region. As an example, the inspection region OPH5 may be provided between the data driving electrodes DPD5. In other words, the second region may be provided between the first regions.

According to exemplary embodiments, it may be possible to easily examine a connection state between a side electrode of a display panel and a driving electrode of a driver unit. This may make it possible to improve driving reliability of a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a display panel comprising a first substrate, a second substrate provided on the first substrate, and side electrodes provided on a side surface of the first substrate and a side surface of the second substrate aligned to the side surface of the first substrate;
    a driver unit comprising a circuit board, driving electrodes provided on the circuit board to face the side electrodes, and driving signal lines provided on the circuit board, the driving signal lines are connected to the driving electrodes, respectively; and
    an adhesive member provided between the side electrodes and the circuit board, the adhesive member comprising:
        a first adhesive portion configured to adhere and electrically connect a first driving electrode of the driving electrodes to a first side electrode of the side electrodes; and
        a second adhesive portion configured to adhere the circuit board to the first side electrode.

2. The display device of claim 1, wherein, when viewed in a plan view of the circuit board, the circuit board comprises:
    a first region on which the first driving electrode is provided;
    a second region not overlapped with the first driving electrode; and
    a bending region connecting the first region to the second region.

3. The display device of claim 2, wherein the second region comprises an inspection region attached to the first side electrode by the second adhesive portion, and
    wherein a first signal line of the driving signal lines connected to the first driving electrode is not overlapped with the inspection region, when viewed in a plan view of the circuit board.

4. The display device of claim 3, wherein at least a portion of the first signal line comprises a bending portion provided to bypass the inspection region.

5. The display device of claim 1, wherein the first adhesive portion and the second adhesive portion are connected to each other to form a single continuous structure.

6. The display device of claim 1, wherein the first adhesive portion is overlapped with the side surface of the second substrate, and
    wherein the second adhesive portion is overlapped with the side surface of the first substrate.

7. The display device of claim 6, wherein the first driving electrode is not overlapped with the side surface of the first substrate.

8. The display device of claim 1, wherein the first adhesive portion is overlapped with the side surface of the first substrate, and
    wherein the second adhesive portion is overlapped with the side surface of the second substrate.

9. The display device of claim 8, wherein the first driving electrode is not overlapped with the side surface of the second substrate.

10. The display device of claim 1, wherein a second driving electrode, which is another of the driving electrodes, is overlapped with the side surface of the first substrate and the side surface of the second substrate, respectively.

11. The display device of claim 1, wherein, when viewed in a plan view of the circuit board, the circuit board comprises:
    a first region, on which the first driving electrode is provided;
    a second region not overlapped with the first driving electrode; and
    a third region spaced apart from the second region with the first region interposed there between, the third region not overlapped with the first driving electrode.

12. The display device of claim 11, wherein the second adhesive portion is configured to connect the second region to the first side electrode, and
    wherein the adhesive member further comprises a third adhesive portion configured to attach the third region to the first side electrode.

13. The display device of claim 12, wherein the circuit board further comprises a first bending region connecting the first region to the second region and a second bending region connecting the first region to the third region.

14. The display device of claim 13, wherein the second region comprises a first inspection region, which is attached to the first side electrode by the second adhesive portion,
    the third region comprises a second inspection region, which is attached to the first side electrode by the third adhesive portion, and
    when viewed in a plan view of the circuit board, a first signal line of the signal lines connected to the first driving electrode is not overlapped with the first inspection region and the second inspection region.

15. The display device of claim 14, wherein at least a portion of the first signal line comprises a bending portion provided to bypass the second inspection region.

16. The display device of claim 1, wherein the circuit board comprises a first region and a second region, which are overlapped with the first adhesive portion and the second adhesive portion, respectively, when viewed in a plan view of the circuit board, and
    wherein the first region and the second region are provided to have a height difference.

17. The display device of claim 1, wherein the driver unit comprises driver units.

18. A display device, comprising:
- a display panel comprising a first substrate, a second substrate provided on the first substrate, and side electrodes provided on a side surface of the first substrate and a side surface of the second substrate aligned to the side surface of the first substrate;
- a driver unit comprising a circuit board, driving electrodes provided on the circuit board and are respectively overlapped with the side surface of the first substrate and the side surface of the second substrate, and driving signal lines provided on the circuit board, the driving signal lines are connected to the driving electrodes, respectively; and
- an adhesive member provided between the side electrodes and the circuit board,
- wherein the circuit board comprises:
  - a first region on which the driving electrodes are provided; and
  - a second region on which the driving electrodes are not provided, and
- wherein the adhesive member is configured to:
  - adhere and electrically connect the driving electrodes disposed on the first region to first sub-side electrodes of the side electrodes; and
  - adhere the second region to second sub-side electrodes of the side electrodes.

19. The display device of claim 18, wherein the second region is provided at both end portions of the first region.

20. The display device of claim 18, comprising plural first regions, wherein the second region is provided between the first regions.

* * * * *